(12) United States Patent
Hwang-Jyh

(10) Patent No.: US 7,188,405 B2
(45) Date of Patent: Mar. 13, 2007

(54) PIN REMOVAL STRUCTURE USED IN PRINTED CIRCUIT BOARD DRILLING MACHINE

(76) Inventor: Shiun Hwang-Jyh, No. 14, Alley 27, Lane 379, Hsing Hsing Street, Lu-chu Hsiang, Taoyuan County (TW)

( * ) Notice: Subject to any disclaimer, the term of this patent is extended or adjusted under 35 U.S.C. 154(b) by 422 days.

(21) Appl. No.: 10/863,473

(22) Filed: Jun. 9, 2004

(65) Prior Publication Data

US 2005/0274005 A1    Dec. 15, 2005

(51) Int. Cl.
*B23P 19/00* (2006.01)
(52) U.S. Cl. .......................... 29/764; 29/426.5; 29/762
(58) Field of Classification Search ............... 29/426.5, 29/762, 764
See application file for complete search history.

(56) References Cited

U.S. PATENT DOCUMENTS 5,375,319 A * 12/1994 Jacobs .......................... 29/762
6,279,225 B1 * 8/2001 Martin et al. .................. 29/740
6,444,082 B1 * 9/2002 Campbell et al. ........... 156/344
6,957,484 B2 * 10/2005 Pupin et al. .................. 29/837

\* cited by examiner

*Primary Examiner*—Richard Chang
(74) *Attorney, Agent, or Firm*—Rosenberg, Klein & Lee

(57) ABSTRACT

A pin removal structure used in printed circuit board drilling machine comprised of a main body, a first driving member, a first driving rod, a collet member, a lower mounting cover, a socket, a second driving member, a plurality of second driving rods, and an air pressure control valve member. The collet member is sleeved vertically onto the locating pin, and through articulation of the air pressure control valve member, the first driving member and the first driving rod having the collet member positioned at its anterior extremity are impelled by air pressure into upward and forward movement, the collet member then guided by the socket fastened to a lower mounting cover to firmly clamp onto the locating pin. Attached to the second driving member, the plurality of second driving rods are at the same time impelled by air pressure into forward and downward movement such that when the second driving rods contact the printed circuit board in which the locating pin is implanted, the force of the forward thrust is applied against the printed circuit board carrying plate, enabling the rapid and safe and, furthermore, accurate and easy extraction of the locating pin.

1 Claim, 5 Drawing Sheets

PIN REMOVAL STRUCTURE USED IN PRINTED CIRCUIT BOARD DRILLING MACHINE

BACKGROUND OF THE INVENTION

1) Field of the Invention

The invention herein relates to a pin removal structure used in printed circuit board drilling machine.

2) Description of the Prior Art

Printed circuit board (PCB) drilling machines are equipped with PCB carrying plates on their drilling platforms to provide for circuit board placement; enabling the drilling of each hole at the exact predetermined positions in the circuit board for the rapid and convenient drilling of circuit boards of the same specifications. Each circuit board specification also includes a quantity of pin holes at predetermined points for the driving in of locating pins that protrude from the circuit board surface and directly provide for keeping the circuit board stationary, the precise positioning of the circuit board affording accurate drilling efficiency. Additionally, since circuit board specifications vary and the said locating pin drilling points are not identical, the locating pins in the circuit boards must be repeatedly extracted and implanted to accommodate circuit board differences.

The current method of extracting locating pins, as indicated in FIG. 1 and FIG. 2, typically consists of a scissor-type pincing tool 70 that clamps the locating pin A, following which the curved bottom section 701 functions as a fulcrum against the circuit board carrying plate B, and the operator presses down the handle ends 702, the prying effect of the lever action pulling out the locating pin A embedded in the circuit board carrying plate B. While it cannot be denied that such an approach is certainly capable of achieving the objective of locating pin removal, following long-term utilization, manufacturers have discovered several obvious shortcomings that await and, furthermore, require improvement, including:

1. Since the locating pins A are tightly nailed into the circuit board carrying plate B, when the pincing tool 70 clamps in the prying approach to effect extraction, the locating pin A is pulled out in a curved line, generating considerable friction against the circuit board carrying plate B and, as such, the operator must exert more strength, the operation obviously consuming too much energy and is inconvenient.

2. Since the curved section 701 of the pincing tool 70 serves continuously as the fulcrum for prying out locating pins A and, furthermore, the downward pressure on the handle 702 is excessively great and unequal, the said curved section 701 is subjected to repeated stress and easily becomes uneven following prolonged usage, which obviously shortens its service life.

3. Since the said locating pin A is tightly implanted in the circuit board carrying plate B and, furthermore, is a small diameter component (most between approximately 1 mm and 5 mm), when the pincer tool 70 extracts, a larger force is required for clamping and, at the same time, a greater force bears down on the handle 702 to the extent that the said locating pin A is frequently severed by the pincer tool 70 and, as such, the objective of extraction cannot be completed and which may even risk the obvious hazard and drawback of having the said severed locating pin A propelled into the eyes of the operator (manufacturers today will not tolerate such a drawback).

SUMMARY OF THE INVENTION

The objective of the invention herein is to provide a pin removal structure used in printed circuit board drilling machine, wherein the collet member is sleeved vertically onto the locating pin, and through articulation of the air pressure control valve member, the said collet member is retracted backward by a first driving body and a first driving rod, with a push-pull sleeve disposed on a socket guiding the clamping of the locating pin; when a second driving rod at the collet member retracts at the same time, a second driving rod is impelled forward and downward in a thrusting movement, rapidly extracting the said locating pin implanted in the printed circuit board carrying plate as the said second driving rod simultaneously contacts the printed circuit board carrying plate in a manner that is efficient and safe and, furthermore, easy and accurate.

Another objective of the invention herein is to provide a pin removal structure used in printed circuit board drilling machine, wherein a plurality of the said second driving rods apply a larger area and equal magnitude of force against the printed circuit board carrying plate and, furthermore, the second driving member vertically impels the said second driving rods such that the said printed circuit board carrying plate surface is not subjected to unevenly exerted pressure and becomes imperfectly flat, thereby increasing its service life.

Yet another objective of the invention herein is to provide a pin removal structure used in printed circuit board drilling machine, wherein the said locating pins are extracted vertically under a coordinated and equalized force by the collet member and the plurality of second driving rods, thereby precluding the prior art shortcoming of operator injury caused by locating pins that are propelled into the air as they are severed, effectively improving and eliminating the drawbacks to achieve the ultimate objective of safe utilization.

DETAILED DESCRIPTION OF THE INVENTION

Figure 2:
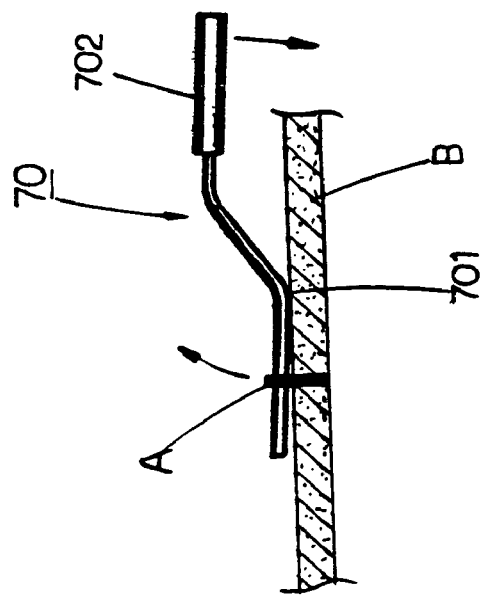
FIG. 2 is a cross-sectional drawing of the conventional pincer tool removing a located pin.
Figure 1:
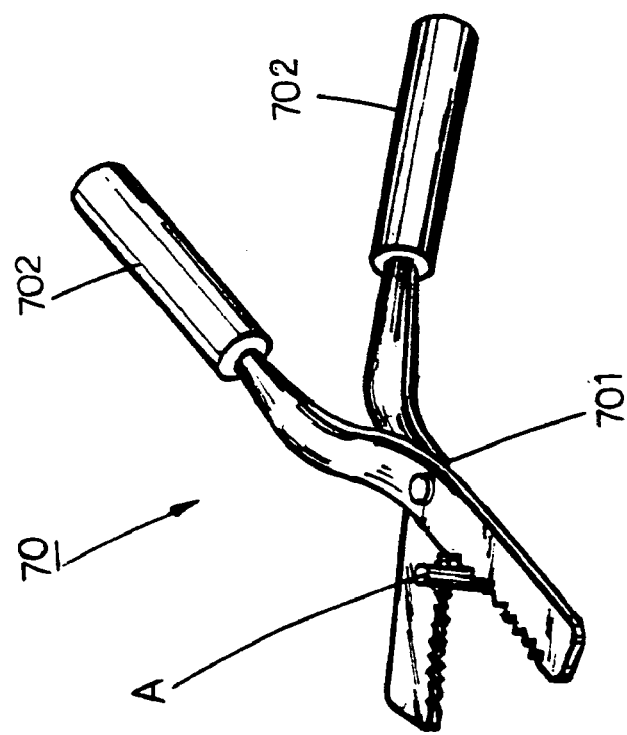
FIG. 1 is an isometric drawing of a conventional scissor-type pincer tool.
Figure 3:
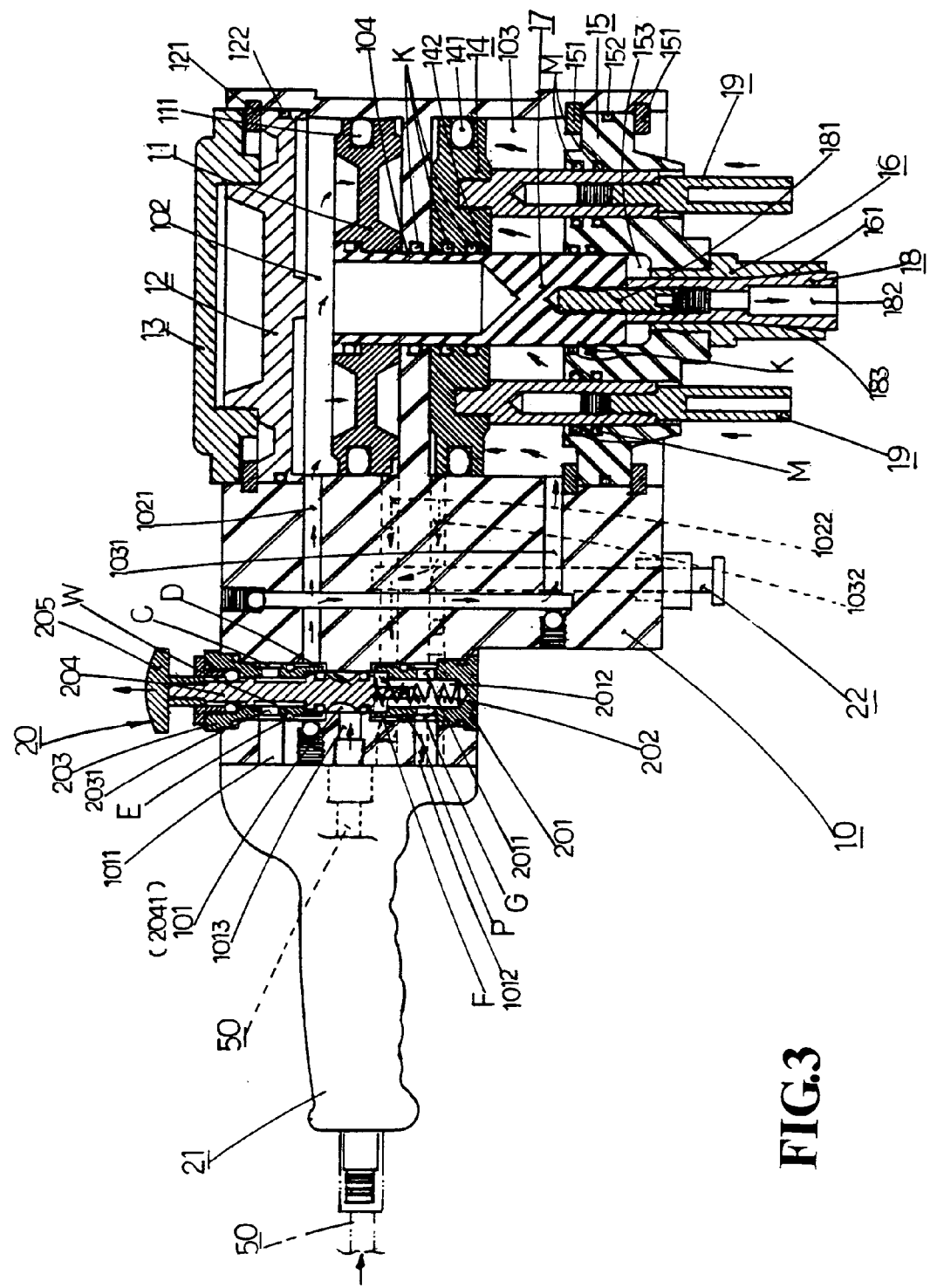
FIG. 3 is a cross-sectional drawing of the invention herein.
Figure 4:
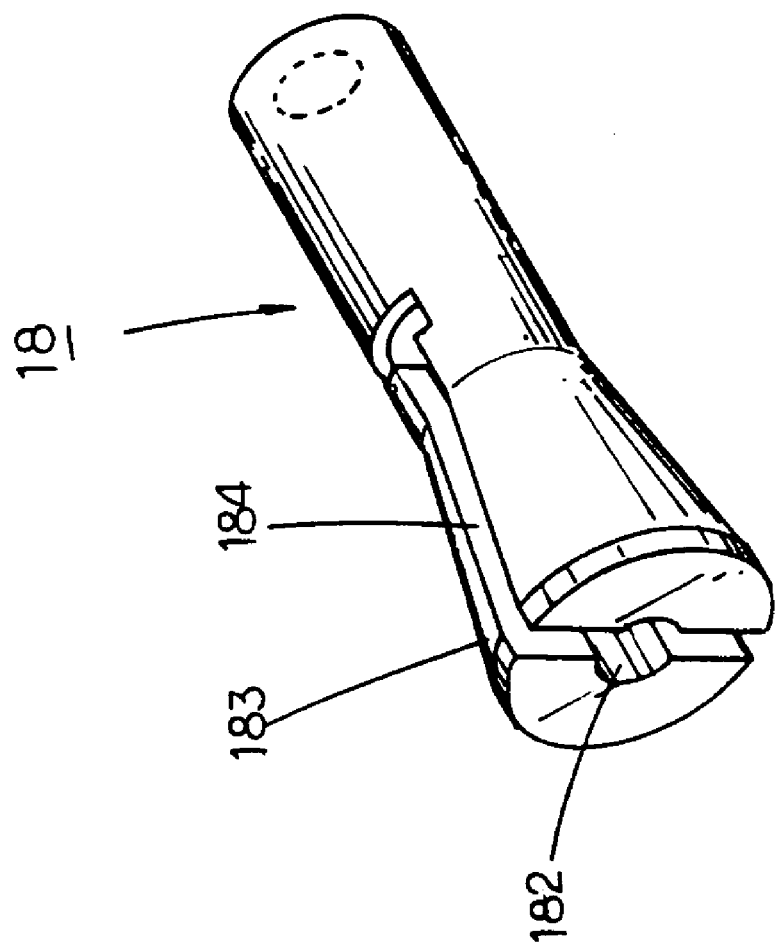
FIG. 4 is an isometric drawing of the collet member of the invention herein.

Referring to FIG. 3, the pin removal structure used in printed circuit board drilling machine of the invention herein is comprised of:

a main body 10 having a cylindrical recess 101 disposed in one end, an upper and lower aligned first channel 102 and second channel 103 at the opposite end, a connective bore 104 in continuity between the said first and second channels 102 and 103, air passages 1022 and 1032 proximal to the first channel 102 upper reach and the second channel 103 lower reach and, furthermore, which are in continuity with the cylindrical recess 101 proximal to its upper end; additionally, air passages 1011, 1012, and 1013 respectively disposed proximal to the upper end, lower end, and middle section position of the cylindrical recess 101, wherein an air intake tube 50 merges with the air passage 1013 proximal to its middle section;

a first driving member 11 slideably disposed in the main body 10 first channel 102 having an airtight sealing ring 111 around its circumferential surface that is postured against the first channel 102;

an upper mounting cover 12 snap fitted on an lock ring 121 at the upper end of the main body 10 first channel 102 having an airtight sealing ring 122 around its circumferential surface for hermetic use;

an outer cover 13 that is fastened over the exterior end of the upper mounting cover 12;

a second driving member 14 slideably disposed in the main body 10 second channel 103 having an airtight sealing ring 141 around its circumferential surface for hermetic use;

a lower mounting cover 15 snap fitted by means of a lock ring 151 onto the lower end of the main body 10 second channel 103 having an airtight sealing ring 152 around its circumferential surface for hermetic use;

a socket 16 fastened to the center of the lower mounting cover 15 having a puller sleeve 161 disposed in the middle of the front end;

a first driving rod 17 coupled to the center of the first driving member 11 and equipped with an airtight sealing ring K that is inserted in an airtight state into the connective bore 104 to penetrate the main body 10 first and second channel 102 and 103, the second driving member 14 center hole 142, and the lower mounting cover 15 center hole 153;

a collet member 18, referring to FIG. 4, inserted into the center hole of the lower mounting cover 15 socket 16, the rear end of which is fastened by a screw 181 to a second driving rod 17 that has a center pinch hole 182 as well as a push-pull neck 183 disposed proximal to the front end of its circumferential surface, the said push-pull neck 183 fitting into the socket 16 push-pull sleeve 161, and slots 184 are disposed between the circumferential surface and the center pinch hole 182, enabling the entire push-pull neck 183 to have elastic constrictive and expansive capability;

a plurality of second driving rods 19 evenly arrayed at four points around the collet member 18 that are each equipped with an airtight sealing ring M and inserted under airtight conditions at the lower mounting cover 15 and attached to the second driving member 14;

an air pressure control valve member 20 installed in the main body 10 cylindrical recess 101 that has a lower mounting member 201, the inferior end of which is fastened airtight to the cylindrical recess 101 bottom end; an airtight sealing ring P positioned proximal to its superior end to maintain airtightness with the cylindrical recess 101; slightly smaller paths above and below the airtight sealing ring P such that an upper vent duct F and a lower vent duct G are respectively formed between it and the cylindrical recess 101; a horizontal connective hole 2011 disposed proximal to the lower extent of the airtight sealing ring P, the said horizontal connective hole 2011 maintaining continuity with the air passage 1012 at the lower end of the cylindrical recess 101 and, furthermore, having a sleeve hole 2012 disposed in the center; an elastic component 202 nested in the lower mounting member 201 center sleeve hole 2012; an upper mounting member 203, the upper end of which is fastened airtight to the cylindrical recess 101 upper end, with an airtight sealing ring E positioned proximal to the lower end to maintain airtightness with the cylindrical recess 101, slightly smaller paths at the upper extent and lower extent of the airtight sealing ring E respectively form an upper vent duct C and a lower vent duct D between it and the cylindrical recess 101, and a horizontal connective hole 2031 disposed proximal to the upper extent of the airtight sealing ring E, the said horizontal connective hole 2031 maintaining continuity with the air passage 1011 at the upper end of the cylindrical recess 101; a control rod 204 inserted in the upper and lower mounting member 201 center hole, the bottom extremity of which is against the elastic component 202 and thereby elastically loading it, that has a vent slot 2041 proximal to the lower end of its circumferential surface, the said vent slot 2041 in continuity with the air passage 1013 at the middle section of the cylindrical recess 101, enabling respective continuity with the air passages 1012 and 1022 of the main body 10 first channel 102 during ascending and descending movement, with a small path disposed proximal to the upper end of the vent slot 2041 forming an air admission duct W between it and the upper mounting member 203 center hole, the said air admission duct W ascending and descending with the control rod 204, and enabling continuity between the upper mounting member 203 horizontal connective hole 2031 and the air passage 1012 confluent with the main body 10 first channel 102; and a knob 205 installed at the control rod 204 top extremity that is pressed to articulate the ascending and descending of the control rod 204;

a handle 21 installed at one side of the main body 10 that provides for carrying and serves as an air intake tube 50;

a speed adjustment shaft 22 installed on the main body 10 and inserted into continuity with the first channel 102 lower reach and the air passage 1022 and 1032 positions between the second channel 103 upper reach and the cylindrical recess 101 that enables control over air flow volume.

Figure 5:
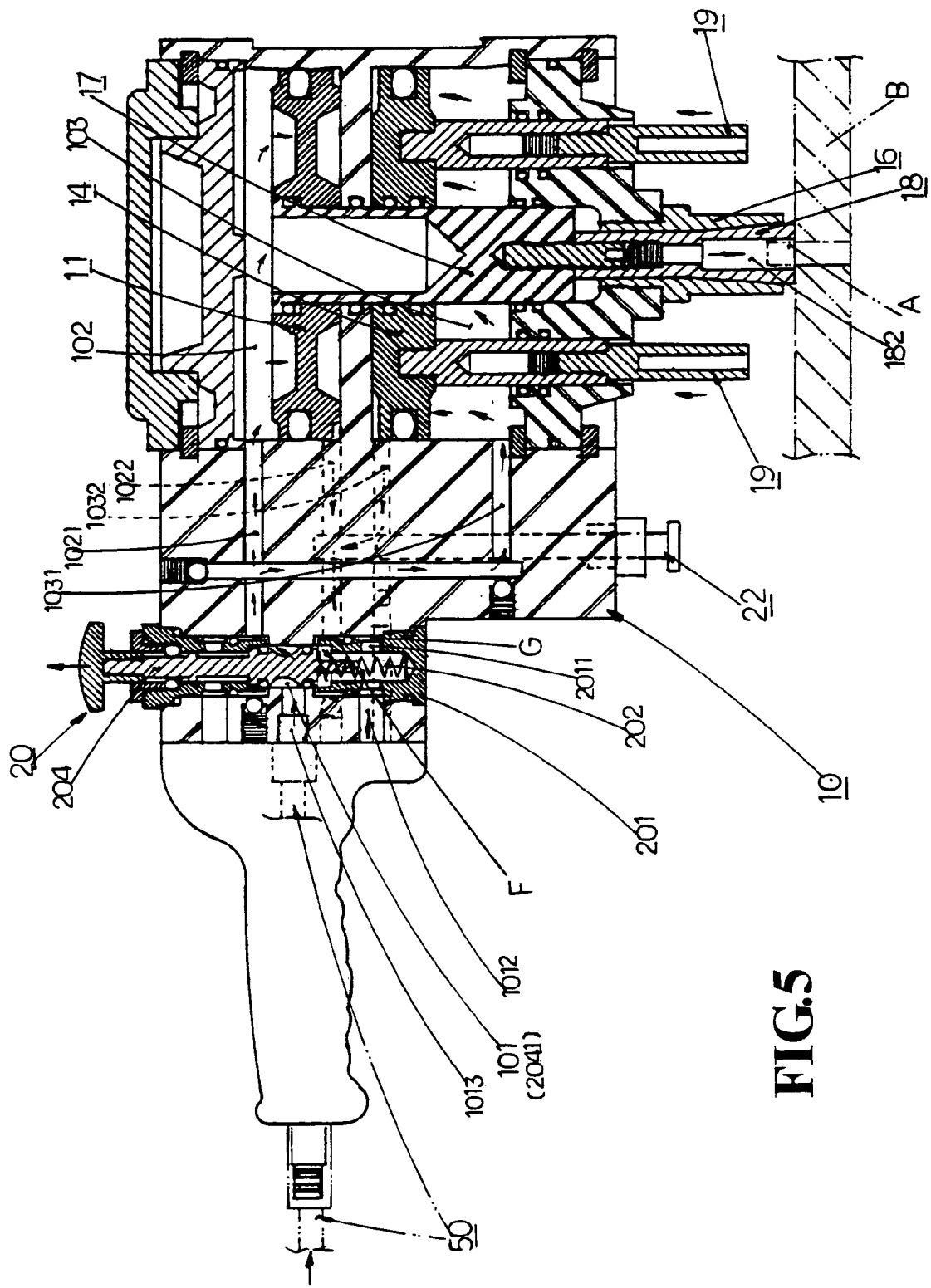
FIG. 5 is a cross-sectional drawing of the alignment sleeve of the invention herein set over a located pin.

Utilizing the said structure of the invention herein, referring to FIG. 3 and FIG. 5, after the said air pressure control valve member 20 is installed at the main body 10 cylindrical recess 101, the elastic component 202 functions to ordinarily maintain the said control rod 204 upward under elastic pressure, the vent slot 2041 at its lower extremity, in addition to always being maintained in continuity with the air passage 1013 of the air intake tube 50 main body 10, when kept upward by elastic pressure, it is maintained in continuity with the air passages 1021 and 1013 of the main body 10 first channel 102 upper reach and the main body 10 second channel 103 bottom reach; as such, after the air intake tube 50 is installed on the pin puller of the invention herein, pressurized air is directly admitted into the main body 10 cylindrical recess 101, respectively guided through the vent slot 2041 of the air pressure control valve member 20 control rod 204 from the main body 10 air passage 1021 into first channel 102 upper extent and from the main body air passage 1013 into the second channel 103 lower extent such that the said first driving member 11 situated in the first channel 102 is subjected to air pressure and impelled into downward movement to the bottommost point, and the said second driving member 14 situated in the second channel 103 is subjected to air pressure and impelled into upward movement to the top most point, furthermore, the first driving rod 17 installed to the first driving member 11 is moved downward until the front end of the collet member 18 positioned at its anterior extremity extends from the socket 16 until the pinch hole 182 is in a dilated state and, at the same time, due to the said second driving rods 19 respectively attached to the second driving member 14, brought into the constricted state as the second driving member 14 moves upward; additionally, when the locating pins A driven into a printed circuit board carry plate B are extracted, the said collet member 18, its pinch hole 182 in the dilated state, is first sleeved vertically onto the exposed portion of each locating pin A to enable extraction.

When the said first driving member 11 is impelled downward and the said second driving member 14 is impelled upward, the air respectively contained by the first channel 102 and the second channel 103 is respectively compressed such that it is forced through the air passage 1022 at the lower reach of the first channel 102 and the air passage 1032 at the upper reach of the second channel 103 as well as the upper and lower vent ducts F and G of the cylindrical recess 101, and then induced from the horizontal connective hole 2011 of the air pressure control valve member 20 lower mounting member 201 to the main body 10 air passage 1012 and discharged.

Figure 6:
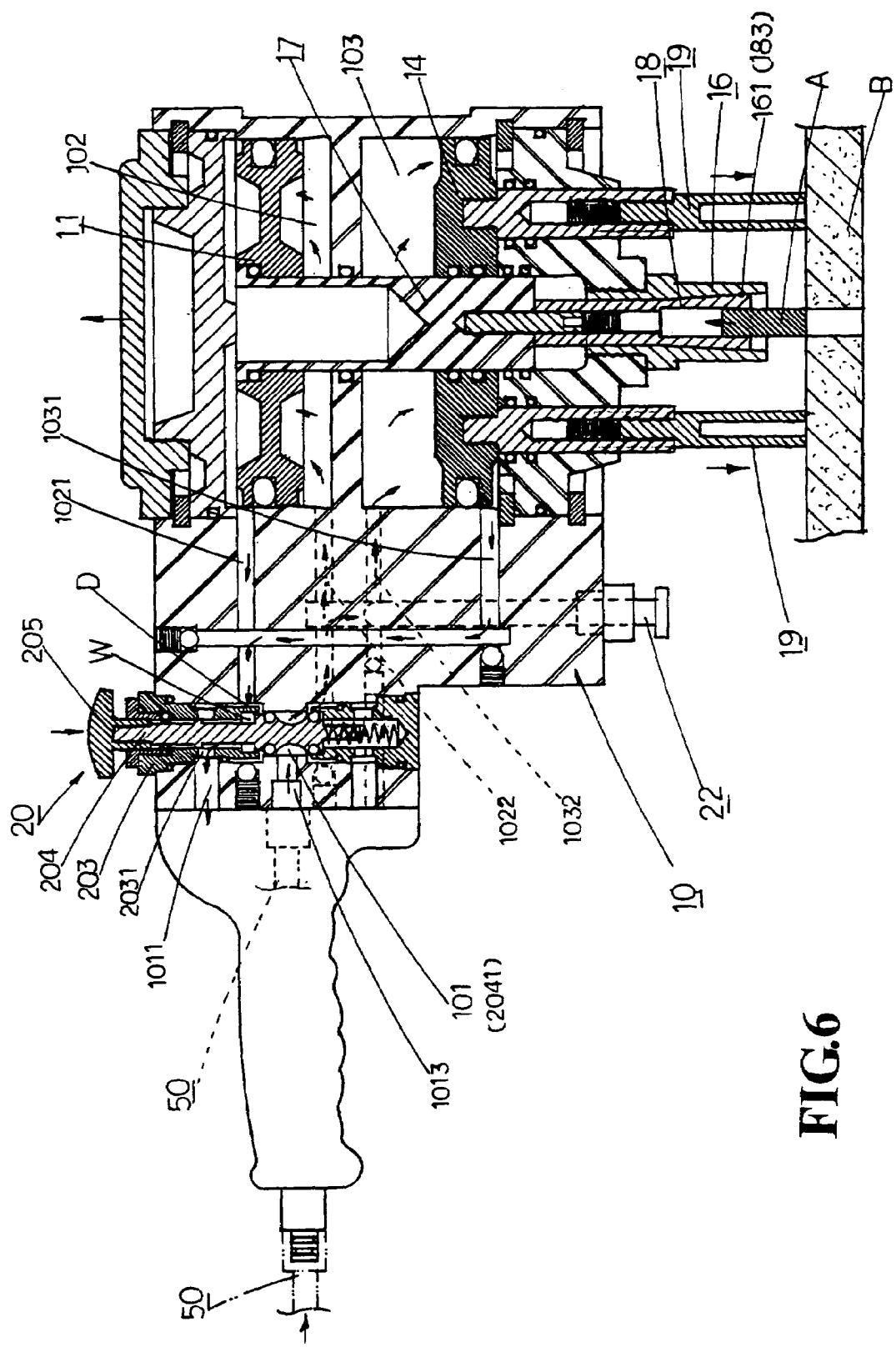
FIG. 6 is a cross-sectional drawing of the invention herein extracting a locating pin.

Referring to FIG. 6, when the air pressure control valve member 20 knob 205 is pressed down until the control rod 204 moves downward to the bottommost point, after the downward movement of the said control rod 204 a vent slot 2041, this changes the continuity at the air passage 1022 at the lower reach of the main body 10 first channel 102 and the air passage 1032 at the upper reach of the second channel 103 air passage 1032, pressurized air forwarded into the cylindrical recess 101 from the said air intake tube 50 is immediately redirected from respective admission via the air passages 1022 and 1032 into the first channel 102 lower reach and the second channel 103 upper reach such that the said first driving member 11 situated in the first channel 102 is immediately impelled into upward and rearward movement until the said collet member 18 installed on first driving rod 17 moves upward and inward, the said socket 16 remaining fixed and stationary, its puller sleeve 161 guiding the said rearward and upward moving collet member 18 elastically loaded push-pull neck 183 to gradually retract, the said collet member 18 pinch hole 182 in the process constricting accurately as a matter of course and, furthermore, tightly clamping the locating pin A; at the same time, the said air entering the second channel 103 pushes the second driving member 14 into forward and downward movement until the said second driving rods 19 disposed on it are brought into downward and forward movement, the said collet member 18 firmly clamping the locating pin A and, naturally, when the said forward and downward moving second driving rods 19 make contact with the printed circuit board carrying plate B, force is immediately applied for the extraction of the locating pin A. In other words, after the said second driving rods 19 contact the printed circuit board carrying plate B, they continue forward and downward, applying force against the printed circuit board carrying plate B, the said collet member 18 firmly clamping the locating pin A embedded in the printed circuit board carrying plate B, the said second driving rods 19 continuing forward and downward with force against the printed circuit board carrying plate B directly causing the entire main body 10 to ascend and, naturally, the said locating pin A is vertically extracted in a manner that is efficient and rapid and, furthermore, easy, accurate, and safe.

When the first driving member 11 is impelled upward and the second driving member 14 is impelled downward, the air respectively contained in the first channel 102 and the second channel 103 is respectively compressed such that it is forced through the air passage 1021 at the upper reach of the first channel 102 and the air passage 1031 at the lower reach of the second channel 103 to the vent duct D of the cylindrical recess 101, and then induced from the air admission duct W of the air pressure control valve member 20 and the upper mounting member 203 horizontal connective hole 2031 to the main body 10 air passage 1012 and discharged.

Additionally, when the extracted locating pin A is released, it is only necessary to relax the hand on the air pressure control valve member 20 to enable the control rod 204 to be resiliently restored by the action of the elastic component 202 and then, as indicated in FIG. 3 and FIG. 5, air entering the air intake tube 50 immediately moves the collet member 18 forward and downward such that the push-pull neck 183 pinch hole 182 dilates and, as such, the collet member 18 clamping the locating pin A quite expeditiously and rapidly achieves release.

To meet actual requirements, the speed adjustment shaft 22 can be articulated to vary the volume of air admittance and discharge to and from the main body 10 first channel 102 and the second channel 103 to thereby control locating pin A extraction speed.

The invention claimed is:

1. A pin removal structure used in a printed circuit board drilling machine comprised of:

a main body having a cylindrical recess disposed in one end, an upper and lower aligned first channel and second channel at an opposite end, a connective bore in communication between the first and second channels, air passages proximal to an upper reach of the first channel and a lower reach of the second channel and, furthermore, which are in communication with the cylindrical recess proximal to an upper end thereof; additionally, air passages respectively disposed proximal to the upper end, lower end, and middle section position of the cylindrical recess, wherein an air intake tube merges with an air passage proximal to a middle section thereof;

a first driving member slideably disposed in first channel of the main body having a first airtight sealing ring around a circumferential surface thereof that is postured against the first channel;

an upper mounting cover snap fitted on a lock ring at the upper end of the said main body first channel having a second airtight sealing ring around a circumferential surface thereof for a hermetic seal;

an outer cover that is fastened over the exterior end of the upper mounting cover;

a second driving member slideably disposed in the second channel of the main body having a third airtight sealing ring around its circumferential surface for a hermetic seal;

a lower mounting cover snap fitted by means of a lock ring onto the lower end of the second channel of the main body having a fourth airtight sealing ring around its circumferential surface for a hermetic seal;

a socket fastened to a center of the lower mounting cover having a puller sleeve disposed in a middle of the front end;

a first driving rod coupled to a center of the said first driving member and equipped with a fifth airtight sealing ring that is inserted in an airtight state into the connective bore to penetrate the first and second channel of the main body, a center hole of the second driving member, and a center hole of the lower mounting cover;

a collet member inserted into a center hole of the lower mounting cover socket, a rear end of which is fastened by a screw to a second driving rod that has a center pinch hole as well as a push-pull neck disposed proximal to a front end of a circumferential surface thereof, the push-pull neck fitting into the puller sleeve of the socket, and slots are disposed between the circumferential surface and the center pinch hole, enabling an entirety of the push-pull neck to have an elastic constrictive and expansive capability;

a plurality of second driving rods evenly arrayed at four points around the collet member that are each equipped with a sixth airtight sealing ring and inserted under airtight conditions at the lower mounting cover and fastened to the second driving member;

an air pressure control valve member installed in the main body cylindrical recess that has a lower mounting member, an inferior end of which is fastened airtight to a bottom end of the cylindrical recess; a seventh airtight sealing ring being positioned proximal to a superior end thereof to maintain airtightness with the cylindrical recess; slightly smaller paths being above and below the seventh airtight sealing ring such that an upper vent duct and a lower vent duct are respectively formed between the seventh sealing ring and the said cylindrical recess; a first horizontal connective hole being disposed proximal to a lower extent of the seventh airtight sealing ring, the first horizontal connective hole maintaining communication with the air passage at a lower end of the cylindrical recess and, furthermore, having a centrally disposed sleeve hole; an elastic component nested in the lower mounting member center sleeve hole; an upper mounting member; an upper end of which is fastened airtight to the upper end of the cylindrical recess, with an eighth airtight sealing ring positioned proximal to the lower end to maintain airtightness with the cylindrical recess, slightly smaller paths at an upper extent and a lower extent of the eighth airtight sealing ring respectively form an upper vent duct and a lower vent duct between the eighth airtight sealing ring and the said cylindrical recess, and a second horizontal connective hole disposed proximal to the upper extent of the eighth airtight sealing ring, the second horizontal connective hole maintaining communication with the air passage at the upper end of the cylindrical recess; a control rod respectively inserted in a center hole of the upper and lower mounting members; a bottom extremity of which is against the elastic component and thereby elastically loading the control rod, the control rod having a vent slot proximal to a lower end of a circumferential surface thereof; the vent slot being in communication with the air passage at the middle section of the cylindrical recess, enabling respective communication with the air passages of the main body first channel during ascending and descending movement, with a small path disposed proximal to an upper end of the vent slot forming an air admission duct between the air passage and the center hole of the upper mounting member; the air admission duct ascending and descending with the said control rod, and enabling communication between the second horizontal connective hole and the air passage confluent with the main body first channel; and a knob installed at a top extremity of the control rod that is pressed to articulate the ascending and descending of the control rod;

a handle installed at one side of the main body that provides for carrying and serves as an air intake tube;

a speed adjustment shaft installed on the main body and inserted into communication with a lower reach of the first channel and the air passage positions between an upper reach of the second channel and the cylindrical recess that enables control over air flow volume.

\* \* \* \* \*